United States Patent [19]
De Man et al.

[11] Patent Number: 4,841,175
[45] Date of Patent: Jun. 20, 1989

[54] ECL-COMPATIBLE INPUT/OUTPUT CIRCUITS IN CMOS TECHNOLOGY

[75] Inventors: Erik De Man; Stefan Meier, both of Munich, Fed. Rep. of Germany

[73] Assignee: Siemens Aktiengesellschaft, Berlin and Munich, Fed. Rep. of Germany

[21] Appl. No.: 110,886

[22] Filed: Oct. 21, 1987

[30] Foreign Application Priority Data

Jan. 23, 1987 [DE] Fed. Rep. of Germany ....... 3701986

[51] Int. Cl.[4] ................ H03K 19/092; H03K 19/086; H03F 3/45
[52] U.S. Cl. .................................... 307/475; 307/443; 307/451; 307/455; 307/264; 307/497; 307/530
[58] Field of Search .............. 307/443, 451, 361, 530, 307/475, 264, 455, 497

[56] References Cited

U.S. PATENT DOCUMENTS 4,649,301 3/1987 Van Tran ............................ 307/530
4,717,845 1/1988 Dunn .................................. 307/451

FOREIGN PATENT DOCUMENTS 0146910 7/1985 Japan .................................. 307/475

Primary Examiner—John S. Heyman
Assistant Examiner—M. R. Wambach

[57] ABSTRACT

ECL-compatible input/output circuits in CMOS technology which meet very strict ECL level demands and are as independent as possible of temperature and field effect transistor parameter fluctuations. This is achieved by a control circuit for reference currents of the current mirror circuits. The control circuit is composed of a sensor stage, of a comparator, of a low-pass filter and of a reference current source. Current mirror circuits are also utilized in the driver stages and in the sensor stage.

15 Claims, 4 Drawing Sheets

ECL-COMPATIBLE INPUT/OUTPUT CIRCUITS IN CMOS TECHNOLOGY

BACKGROUND OF THE INVENTION

The invention relates to ECL-compatible input/output circuits in CMOS technology.

ECL and CMOS circuits are frequently utilized in semi-conductor circuit technology; the ECL circuits (emitter-coupled logic) have the shortest switching times of all logic families. These switching times lie in the region of a few nanoseconds and also partly extend below one nanosecond. Complementary MOSFET transistors are utilized in CMOS circuits; the ohmic output load of the CMOS circuits is thereby extremely low because of the high input resistances. The switching time thereby becomes greater as the capacitive output load becomes higher. Given a higher capacitive output load, the switching time has the order of magnitude of about ten nanoseconds and above.

It is necessary in numerous cases to interconnect CMOS circuits with other logic families, including ECL logic circuits. ECL-compatible input/output circuits are thereby increasingly required in CMOS technology given higher clock frequencies. The design of such input/output circuits is complicated by a plurality of different prescribed input levels and guaranteed output levels of the ECL circuits of different manufacturers. Accordingly, the input/output circuits must be designed with narrow tolerances for the high level and the low level.

For example, the Siemens gate arrays exhibit the smallest range of allowable input voltages for the output circuits. The range here for the level V high and V low are:

$-1.025$ volts $<$ V high $< -0.880$ volts, and
$-1.810$ volts $<$ V low $< -1.620$ volts, corresponding to the conventions in ECL technology with 0 volts and $-5$ volts as operating voltages.

In conventions of CMOS technology with $V_{DD}=5$ volts and $V_{SS}=0$ volts it follows therefrom that:

3.975 volts $<$ V high $<$ 4.120 volts, and 3.190 volts $<$ V low $<$ 3.380 volts.

For the frequency range coming into consideration, the output circuits must be designed for driving lines that are terminated with a resistor having the size of the characteristic impedance of the line.

The input circuits in CMOS technology must thereby be designed such that they can reliably descriminate the input signals as low level or high level even given the smallest boost still allowed. For example, the ECL circuits of series F.10K of Fairchild thereby have the lowest output boost. Therefore, for these circuits:

$-1.100$ volts $<$ V high, and
V low $< -1.525$ volts, corresponding to the conventions in ECL technology with 0 volts and $-5$ volts as operating voltages.

For the CMOS technology having levels of $V_{DD}=5$ volts, $V_{SS}=0$ volts:

3.900 volts $<$ V high, and
V low $<$ 3.475 volts.

A further demand made of the input/output circuits in the frequency range under consideration is to keep the transit time due to transistor parameter fluctuations as low as possible. This is important so that a correct time behavior for the transmission of data between the circuits is assured given interconnection of various circuits having different transistor parameters.

SUMMARY OF THE INVENTION

The object of the present invention is to produce ECL-compatible input/output circuits in CMOS technlogy which meet very strict ECL level demands and are as independent as possible of temperature fluctuations and transistor parameter fluctuations.

The input/output circuits contain a plurality of driver stages, a sensor stage, a comparator, a low pass filter and a reference current source. The sensor stage, the comparator, the low pass filter and the reference current source form a control circuit. The comparator computer has two inputs and an output. The output is connected to the reference current source via the low pass filter. The reference current source has $n+1$, where n is a whole number, of outputs and has a respective output wired to a corresponding driver stage and to the sensor stage. An output of the sensor stage is connected to a first input of the two inputs of the comparator. A second input of the comparator is connected to an external reference voltage. The driver stages and the sensor stage each contain an external terminal. The sensor stage contains an input wired to a positive voltage. The driver stages contain inputs for input signals of the ECL-compatible input/output circuits.

The advantages of the present invention are particularly achieved in that all ECL gate arrays of the standard manufacturers can be wired with the input/output circuits in CMOS technology. A control circuit thereby compensates for all temperature fluctuations and transistor parameter fluctuations and is designed such that it can be used both for the input circuits as well as for the output circuits.

BRIEF DESCRIPTION OF THE DRAWINGS

The features of the present invention which are believed to be novel, are set forth with particularity in the appended claims. The invention, together with further objects and advantages, may be best understood by reference to the following description taken in conjunction with the accompanying drawings, in the several figures of which like reference numerals identify like elements, and in which:

DESCRIPTION OF THE PREFERRED EMBODIMENT

Figure 1:
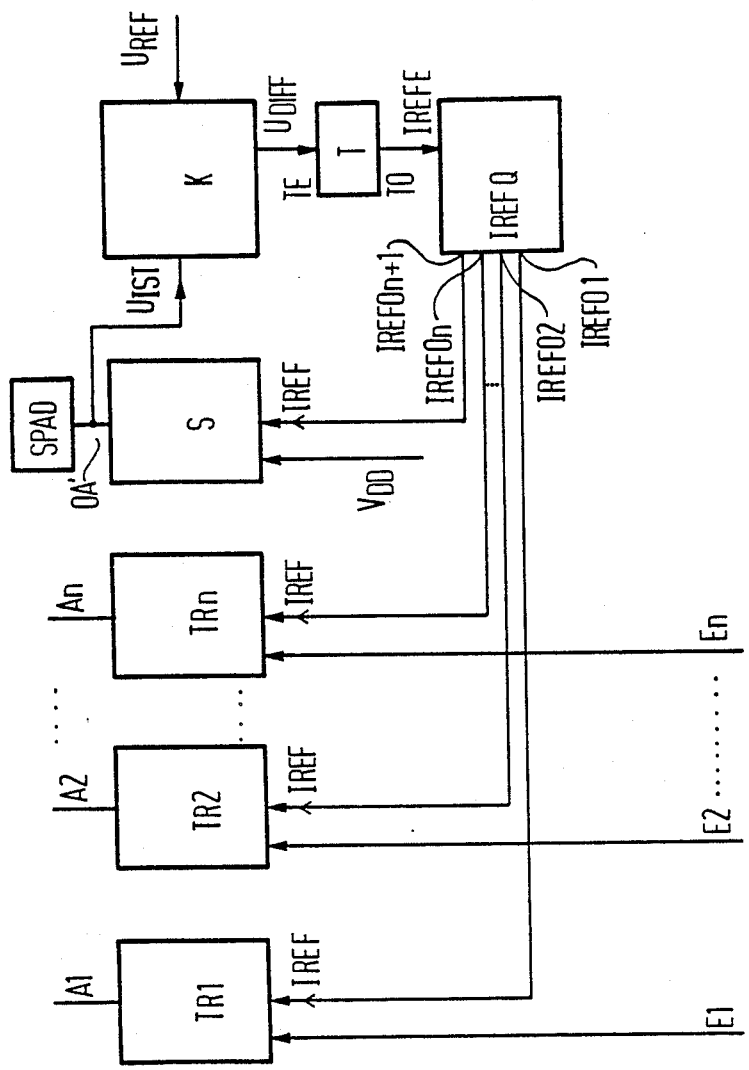
FIG. 1 is a block diagram schematically depicting the overall input/output circuit with driver stages and the control circuit composed of a sensor stage, of a comparator, of a low-pass filter and of a reference current source.

FIG. 1 shows the overall circuit of an ECL-compatible input/output circuit in CMOS technology. The driver stages TR1, TR2, ... TRn optionally contain an input circuit or output circuit. FIGS. 4, 5, 6 and FIG. 7 show the components of the control circuit.

In order to be able to set the V high level more exactly at the output of the output circuits, the impressed reference current IREF can be set based on the fluctuation of component parameters. Since an external adjustment is too involved for the reference current IREF, a control circuit has been provided. For this purpose, a sensor stage S has been attached to the driver stages TR1, TR2, ... TRn, this sensor stage S being wired at the input such that its output OA' always lies at V high. The overall control circuit is composed of the sensor stage S, of the comparator K, of the low-pass filter T and of the reference current source IREFQ. The comparator K contains two inputs $U_{IST}$, $U_{REF}$, for the actual output voltage of the sensor stage S and an externally applied reference voltage (having the value of the rated value of V high respectively). The signal deriving from the comparison of these latter voltage quantities is supplied from the output $U_{DIFF}$ of the comparator K into the reference current source IREFQ via the low-pass filter T. The low-pass filter T has an input TE and output TO, whereas the reference current source IREFQ has an input IREFE but n+1 outputs IREFO1, IREFO2, ... IREFOn, IREFOn+1. The reference current source IREFQ is therefore constructed such that a separate line having an impressed reference current IREF is conducted to every driver stage TR1, TR2, ... TRn. This is necessary since transistors which form a current mirror circuit in the driver stages and are supplied with the reference current IREF must always be arranged in immediate proximity in order to minimize an influence of parameter variation within the overall circuit. In addition, lines having impressed currents are not as sensitive to capacitive in-couplings. The driver stages TR1, TR2, ... TRn each contain a terminal A1, A2, ... An, and the sensor stage S has a terminal SPAD for additional, external components and for taking the output signals. Input signals of the ECL-compatible input/output signals are conducted via the inputs E1, E2, ... En of the driver stages. Since the sensor stage S should always lie at V high at its output, its input is wired with a positive voltage $V_{DD}$.

Figure 2:
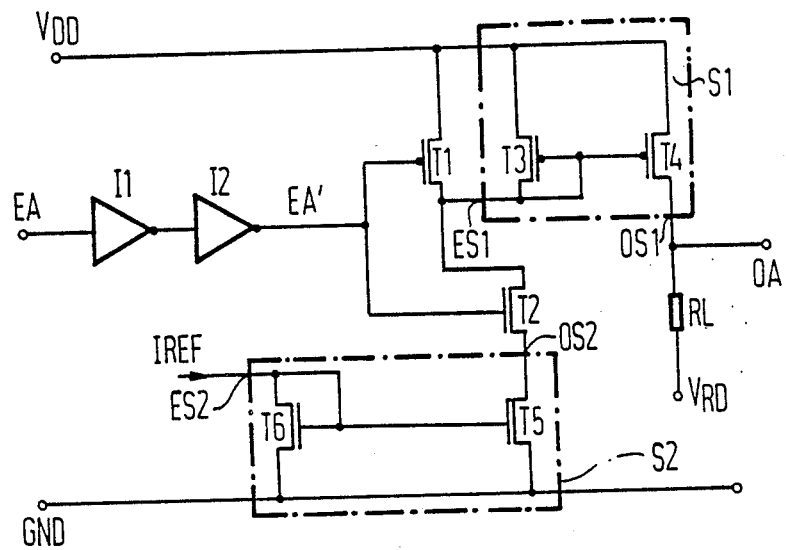
FIG. 2 is a circuit schematic of a driver stage for an output circuit in CMOS technology.

FIG. 2 shows a driver stage that is constructed as an output stage and contains two current mirror circuits S1, S2, an external load resistor RL, and a field effect transistor pair T1, T2 as well as a plurality of preceeding inverter stages I1, I2. The input EA is connected to the input EA' via the series-connected inverter stages I1, I2, this input EA' being connected to the gate of the p-channel field effect transistor T1 and to the gate of the n-channel field effect transistor T2. The field effect transistor pair T1, T2 thereby forms a series circuit, whereby the source terminal of the p-channel field effect transistor T1 is connected to the positive voltage $V_{DD}$ and the source terminal of the n-channel field effect transistor T2 is connected to the output OS2 of the first current mirror circuit S2. The same current mirror circuit S2 is connected to the ground GND and has the impressed reference current IREF applied to its input ES2. By contrast, the second current mirror circuit S1 is connected to a positive voltage $V_{DD}$ and its input ESL is connected to the drain terminal of the p-channel field effect transistor T1 and the drain terminal of the n-channel field effect transistor T2.

The output OS1 of the current mirror circuit S1 represents, first, the output OA of the output stage and is simultaneously connected to the voltage VRD via the resistor RL. The resistor RL is an external resistor and its value of resistance amounts to 100 Ohms. The voltage level of the voltage VRD is fixed at +3.3 volts. Both current mirror circuits S1 and S2 are respectively constructed with two field effect transistors. The second current mirror circuit S1 thereby contains two p-channel field effect transistors T3, T4, whereby the gate terminal of the first p-channel field effect transistor T3 and the gate terminal of the second p-channel effect transistor T4 are connected to the drain terminal of the first p-channel field effect transistor T3 which simultaneously also forms the input ES1 of the second current mirror circuit S1. Both source terminals of the p-channel field effect transistors T3, T4 are connected to a positive voltage $V_{DD}$ and the output OS1 of the second current mirror circuit S1 is formed by the drain terminal of the second p-channel field effect transistor T4.

The first current mirror circuit S2 contains two n-channel field effect transistors T6, T5 and is constructed such that a gate terminal of the first n-channel field effect transistor T5 is connected to the gate terminal and to the drain terminal of the second n-channel field effect transistor T6; these also simultaneously form the input ES2 of the first current mirror circuit S2. The source terminals of the two n-channel field effect transistors T6, T5 are connected to ground GND and the drain terminal of the first n-channel field effect transistor T5 thereby forms the output OS2 of the first current mirror circuit S2. The ratio of the channel widths of the field effect transistors in the current mirror circuits in the first current mirror circuit $\Omega$ amounts to T3:T4=1:8.125 and amounts to T6:T5=1:10 in the second current mirror circuit S1. For switching between the levels V high and V low, the field effect transistor pair T1, T2 is inserted into the circuit of FIG. 2; the first current mirror circuit S2 thereby decouples the impressed reference current IREF from the following current mirror circuit S1.

Figure 3:
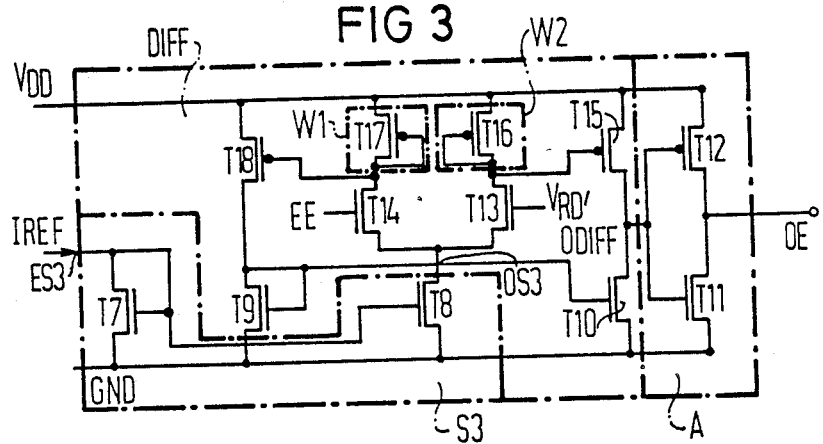
FIG. 3 is a circuit schematic of a driver stage as an input circuit in CMOS technology.

In FIG. 3, a driver stage is constructed as an input stage and thereby contains a current mirror circuit S3, an output driver stage A, as well as a differential amplifier DIFF. Current mirror circuit S3, output driver stage A and the differential amplifier DIFF are connected to ground GND, whereby the latter two are additionally connected to a positive voltage $V_{DD}$. The current mirror circuit S3 has an input ES3 which receives a current reference value IREF and has its output OS3 connected to the differential amplifier DIFF. Since the full CMOS boost is not present at its output 0DIFF under all conditions (fluctuations of field effect transistor parameters and of the positive voltage $V_{DD}$), an output driver stage A follows. The current mirror circuit S3 with the controlled current reference value IREFF at the input ES3 effects the feed of a higher current via the output OS3 given a deterioration of the field effect transistor parameter in the differential amplifier DIFF.

The current mirror circuit S3 contains two n-channel field effect transistors T7, T8, whereby a gate terminal of the first field effect transistor T7 and a gate terminal of the second field effect transistor T8 are connected to a drain terminal of the first field effect transistor T7 which simultaneously forms an input ES3 of the current mirror circuit S3. The source terminal of both field effect transistors T7, T8 is connected to the ground GND and the drain terminal of the second field effect transistor T8 forms an output OS3 of the current mirror circuit S3. The channel width ratio of the first field effect transistor to the second field effect transistor T7:T8 amounts to 1:1.

The output driver stage A contains two series-connected field effect transistors T11, T12. A p-channel field effect transistor T12 thereby has a source terminal connected to the positive voltage $V_{DD}$ and an n-channel field effect transistor T11 has a source terminal connected to ground GND. The output 0DIFF of the differential amplifier DIFF is connected to the gate terminal of the p-channel field effect transistor T12 and to the gate terminal of the n-channel field effect transistor T11. The drain terminals of both field effect transistors form the output OA of the output driver stage A.

The differential amplifier contains four n-channel field effect transistors T9, T10, T13, T14, two p-channel field effect transistors T15, T18, as well as two p-channel field effect transistors T16, T17 connected as resistors W1, W2. A source terminal of a first and of a second n-channel field effect transistor T14, T13 is connected to the output OS3 of the current mirror circuit S3; a gate terminal of the first n-channel field effect transistor T14 is connected to the first input EE of the differential amplifier DIFF; and a gate terminal of the second n-channel field effect transistor T13 is connected to a second input provided with the voltage VRD'. The first input EE is later connected to an input E1, E2, ... En of the driver stages, whereas the second input is provided with a voltage of −1.3 volts. The drain terminals of the first and second n-channel field effect transistors T14, T13 are connected to a positive voltage $V_{DD}$ via a first and via a second resistor W1, W2. The latter resistors are each formed by a p-channel field effect transistor T17, T16, whereby the gate terminal and the drain terminal of the respective p-channel field effect transistors are wired in common. The drain terminal of the first n-channel field effect transistor T14 is connected to a series circuit of a first p-channel field effect transistor T18 and of a third n-channel field effect transistor T9 formed at the gate terminal of the first p-channel field effect transistor T18. The drain terminal of the second n-channel field effect transistor T13 is connected to a series circuit of a second p-channel field effect transistor T15 and of a third n-channel field effect transistor T10 formed at the gate terminal of the second p-channel field effect transistor T15. These series circuits themselves are mutually connected via a gate terminal and via a drain terminal of the third n-channel field effect transistor T9 to the gate terminal of the fourth n-channel field effect transistor T10. Both series circuits are supplied with the positive voltage $V_{DD}$ via the source terminals of the first p-channel field effect transistor T18 and of the second p-channel field effect transistor T15, whereas the source terminals of the third n-channel field effect transistor T9 and of the fourth n-channel field effect transistor T10 are connected to ground.

The voltage amplification of the input differential circuit formed by the first and second n-channel field effect transistors T13, T14 and by the p-channel field effect transistors T17, T16 is slight since the p-channel field effect transistors T17, T16 are connected as resistors. The actual voltage amplification occurs in the two following series circuits, whereby the composite output signal can be taken at the output 0DIFF of the differential amplifier DIFF. Since the full CMOS boost is not present at this output under all conditions, for example given fluctuations of the field effect transistor parameters or of the voltage $V_{DD}$, the output signal is further amplified via a following output driver stage A.

Figure 4:
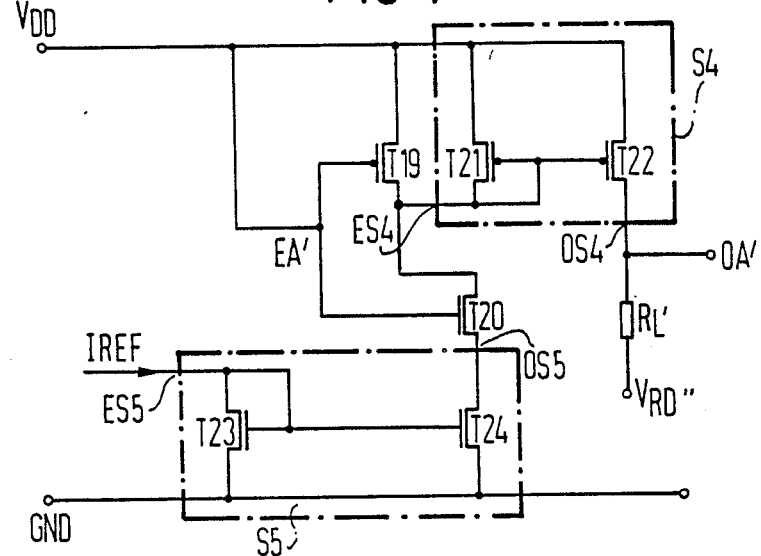
FIG. 4 is a circuit schematic of a sensor stage in CMOS technology.

The sensor stage S shown in FIG. 1 is constructed analogously with output stage shown in FIG. 2. As shown in FIG. 4, et two current mirror circuits S4 and S5 each having an input ES4, ES5 and each having an output OS4 and OS5. The current mirror circuits S4 and S5 are each formed of two field effect transistors, two p-channel field effect transistors T21, T22 in the current mirror circuit S4 and two n-channel field effect transistors T23 and T24 in the current mirror circuit S5. By contrast to the output stage in FIG. 2, however, the input EA' of the series circuit formed of the n-channel field effect transistor T19 and of the p-channel field effect transistor T20 is directly connected to the positive voltage $V_{DD}$. For this reason, the voltage V high is always present at the output OA' of the sensor stage S. The terminal SPAD (shown in FIG. 1) is connected to the output OA' so as to provide a connection point for external equipment.

In order to reduce the power consumption of the sensor stage S, the external load resistor RL' can be increased to one Kohn and the field effect transistor T22 can be designed narrower by a factor of 10. This means that its channel width W now amounts to only 130 μm instead of 1300 μm in FIG. 2. The voltage VRD" for the load resistor RL' is set to a level of +3.3 V analogous to the voltage VRD in FIG. 2.

Figure 5:
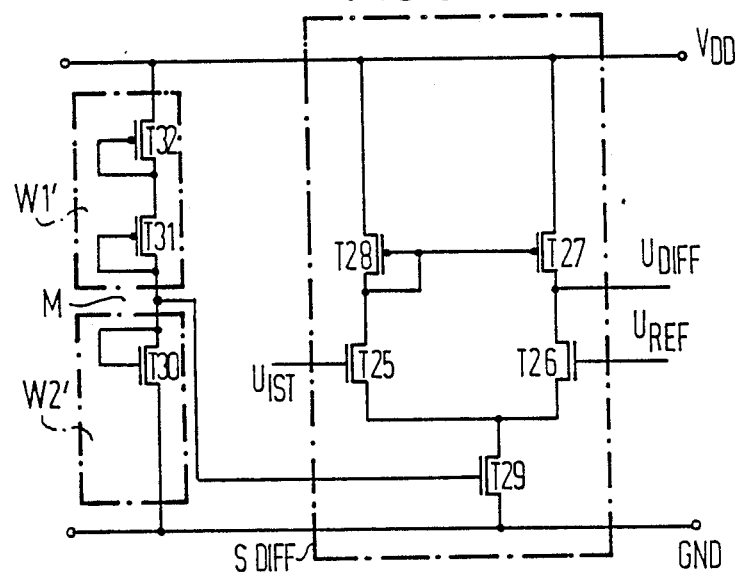
FIG. 5 is a circuit schematic of a comparator in CMOS technology.

The comparator K in FIG. 5 contains a differential amplifier having current mirror circuit SDIFF and additionally contains two series-connected resistors W1', W2'. The differential amplifier is thereby formed of two n-channel field effect transistors T25, T26 each having an input $U_{IST}$, $U_{REF}$. Both source terminals of the latter field effect transistors are connected to the ground GND via a drain terminal of a third n-channel field effect transistor T29. The drive of this third n-channel field effect transistor T29 is undertaken via a voltage divider formed of the resistors W1', W2'. To this end, the gate terminal of the third n-channel field effect transistor T29 is connected to the junction M of the voltage divider. The current mirror circuit contains two p-channel field effect transistors T27, T28 both of whose source treminals are connected to the positive voltage $V_{DD}$, a drain terminal of the first p-channel field effect transistor T28 being connected to the gate terminals of the first and second p-channel field effect transistors T28, T27. Since the current mirror circuit follows the differential amplifier, the drain terminals of the first p-channel field effect transistor T28 and of the first n-channel field effect transistor T25 as well as, the drain terminals of the second p-channel field effect transistor T27 and of the second n-channel field effect transistor T26 are connected to one another. The drain terminals of the last two field effect transistors also simultaneously form the output UDIFF of the comparator at which the output signal can be taken.

The first resistor W1' of the voltage divider circuit is formed of two series-connected p-channel field effect transistors T31, T32, whereby the gate and the drain terminal of the same p-channel field effect transistors are wired in common. Only one n-channel field effect transistor T32 whose gate and drain terminals are combined is required for the second resistor W2' of the voltage divider circuit.

Figure 6:
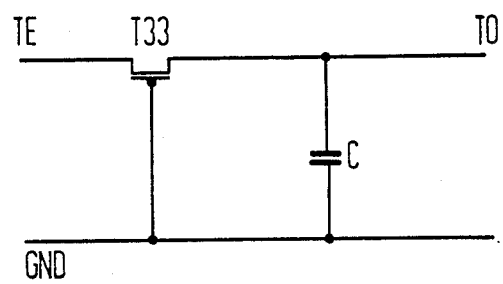
FIG. 6 is a circuit schematic of a low-pass filter.

The low-pass filter shown in FIG. 6 for the control circuit is composed only of two components, a p-channel field effect transistor T33 having minimum channel width and used as a resistor and a capacitor C having a value of 2-3 pF which is connected in the shunt arm in common with the gate terminal of the p-channel field effect transistor T33. The input TE and the output T0 of the low-pass filter are connected to the drain and source terminals, respectively, of the field effect transistor T33.

Figure 7:
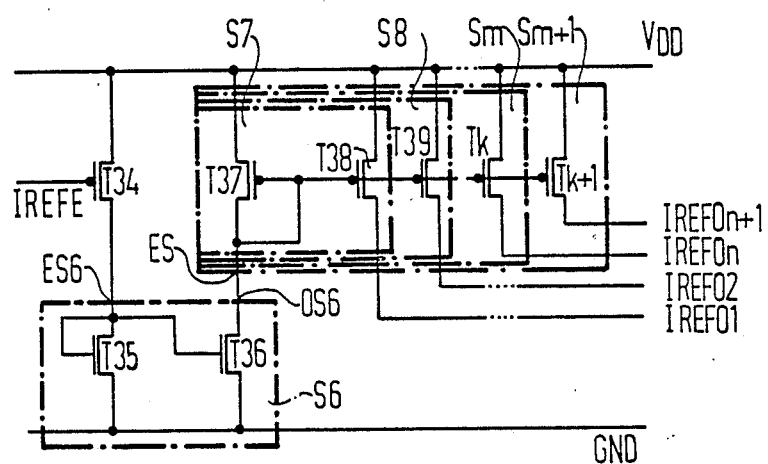
FIG. 7 is a circuit schematic of a reference current source in CMOS technology.

FIG. 7 shows the reference current source IREFQ having the input IREFE, as well as, the outputs IREFO1, IREFO2, ... IREFOn, IREFOn+1. The reference current source IRERQ is composed of m−4 current mirror circuits S6, S7, S8, ... Sm, Sm+1 as well as of a p-channel field effect transistor T34. An input signal at the input IREFE is transmitted via the p-channel field effect transistor T34 into the current mirror circuit S6 and is transmitted from here into the remaining current mirror circuits S7, S8, ... Sm, Sm+1. To this end, the input IREFE is connected to the gate terminal of the field effect transistor T34, and the source terminal of the same field effect transistor is connected to the positive voltage $V_{DD}$ and its drain terminal is connected to the input ES6 of the remaining current mirror circuit S7, S8, ... Sm, Sm+1. Whereas the latter current mirror circuits are still supplied with a positive voltage $V_{DD}$, the current mirror circuit S6 is also additionally connected to the ground GND.

All current mirror circuits of the reference current source IREFQ are each formed of two field effect transistors. The first current mirror circuit S6 thereby contains two n-channel field effect transistors T35, T36, whereby the gate terminal of the first n-channel field effect transistor T36 is connected to the gate terminal and to the drain terminal of the second n-channel field effect transistor T35; these terminals also simultaneously form the input ES6 of the first current mirror circuit S6. The source terminals of these two field effect transistors T35, T36 are each connected to ground GND and the drain terminal of the first field effect transistor T36 forms the output OS6 of the same current mirror circuit. The remaining current mirror circuits S7, S8, ... Sm, Sm+1 comprise a shared, first p-channel input transistor T37 and a respective second, third ... p-channel output transistor T38, T39, ... Tk, Tk+1. The gate terminal of the first p-channel field effect transistor T37 forms the input ES in common with its drain terminal and is additionally connected to the gate terminals of the remaining p-channel field effect transistors T38, T39, ... Tk, Tkn. The drain terminals of the second, third, fourth, ... p-channel output transistors form the outputs IREFO1, IREFO2, ... IREFOn, IREFOn+1, whereas all source terminals of the field effect transistors T37, T38, T39, ... Tk, Tk+1 are connected to a positive voltage $V_{DD}$.

The invention is not limited to the particular details of the apparatus depicted and other modifications and applications are contemplated. Certain other changes may be made in the above-described apparatus without departing from the true spirit and scope of the invention herein involved. It is intended, therefore, that the subject matter in the above depiction shall be interpreted as illustrative and not in a limiting sense.

What is claimed is:

1. An ECL-compatible input/output circuit in CMOS technology, comprising a plurality of driver stages, a sensor stage, a comparator, a low-pass filter and a reference current source; the sensor stage, the comparator, the low-pass filter and the reference current source forming a control circuit; the comparator having two inputs and an output; the output of the comparator connected to the reference current source via the low-pass filter; the reference current source having n+1, where n is a whole number, outputs, and having a respective output connected to a corresponding driver stage and to the sensor stage; an output of the sensor stage being connected to a first input of the two inputs of the comparator; a second input of the two inputs of the comparator being connected to an external reference voltage; the driver stages and the sensor stage each containing an external terminal; the sensor stage containing an input connected to a positive voltage; and the driver stages containing inputs for input signals of the ECL-compatible input/output circuit.

2. The ECL compatible input/output circuit in CMOS technology according to claim 1, wherein the driver stages and the sensor stage are constructed as an output stage, each containing two current mirror circuits, a load resistor, a field effect transistor pair having a first p-channel field effect transistor and a first n-channel field effect transistor; and input connected to a gate terminal of the first p-channel field effect transistor and to a gate terminal of the first n-channel field effect transistor; the field effect transistor pair forming a series circuit; a source terminal of the first p-channel field effect transistor connected to a positive voltage, a source terminal of the first n-channel field effect transistor connected to an output of the first current mirror circuit; an input of the first current mirror circuit connected to a reference current value; the first current mirror circuit connected to ground; the second current mirror circuit connected to the positive voltage, and an input of the second current mirror circuit connected to a drain terminal of the first p-channel field effect transistor and to a drain terminal of the first n-channel field effect transistor, an output of the second current mirror circuit connected to a load resistor and to an output of the output stage; a further terminal of the load resistor receiving a load voltage.

3. The ECL-compatible input/output circuit in CMOS technology according to claim 2, wherein a plurality of series-connected inverter stages are arranged in the driver stages preceeding the input of the field effect transistor pair; an input of a first inverter stage connected to an input of the driver stages.

4. The ECL-compatible input/output circuit in CMOS technology according to claim 2, wherein the input of the field effect transistor pair in the sensor stage is connected to a positive voltage.

5. The ECL-compatible input/output circuit in CMOS technology according to claim 2, wherein the second current mirror circuit contains two p-channel field effect transistors; a gate terminal of a first p-channel field effect transistor of the two p-channel field effect transistors and a gate terminal of a second p-channel effect transistor of the two p-channel field effect transistors connected to a drain terminal of the first p-channel field effect transistor which forms an input of the second current mirror circuit; source terminals of the two p-channel field effect transistors connected to the positive voltage; a drain terminal of the second p-channel field effect transistor forming an output of the second current mirror circuit; the first current mirror circuit containing two n-channel field effect transistors; a gate terminal of a first n-channel field effect transistor connected to a gate terminal and to a drain terminal of a second n-channel field effect transistor which forms the input of the first current mirror circuit; source terminals of the two n-channel field effect transistors connected to ground; a drain terminal of the first n-channel field effect transistor forming an output of the first current mirror circuit.

6. The ECL-compatible input/output circuit in CMOS technology according to claim 1, wherein the driver stages are constructed as input stages which contain a current mirror circuit, an output driver stage and a differential amplifier; the current mirror circuit, the output driver stage and the differential amplifier connected to ground; the output driver stage and the differential amplifier connected to a positive voltage; a current reference value connected to an input of the current mirror circuit; and an output of the current mirror circuit being connected to the differential amplifier having an output connected to the output driver stage.

7. The ECL-compatible input/output circuit in CMOS technology according to claim 6, wherein the current mirror circuit contains two n-channel field effect transistors; a gate terminal of a first field effect transistor of the two n-channel field effect transistors and a gate terminal of the second field effect transistor of the two n-channel field effect transistors connected to a drain terminal of the first field effect transistor which forms in input of the current mirror circuit; a source terminal of the two field effect transistors connected to ground; a drain terminal of the second field effect transistor forming an output of the current mirror circuit.

8. The ECL-compatible input/output circuit in CMOS technology according to claim 6, wherein the output driver stage contains two series-connected field effect transistors, a p-channel field effect transistor having a source terminal connected to the positive voltage and an n-channel field effect transistor having a source terminal connected to ground; a gate terminal of the p-channel field effect transistor and of the n-channel field effect transistor connected to the output of the differential amplifier; a drain terminal of the p-channel field effect transistor and a drain terminal of the n-channel field effect transistor forming the output of the output driver stage.

9. The ECL-compatible input/output circuit in CMOS technology according to claim 6, wherein the differential amplifier contains four n-channel field effect transistors, two p-channel field effect transistors and two resistors; a source terminal of a first and of a second n-channel field effect transistor connected to the output of the current mirror circuit; a gate terminal of the first n-channel field effect transistor forming a first input of the differential amplifier and connected to an input of the driver stages, and a gate terminal of the second n-channel field effect transistor forming a second input for a load voltage; the first n-channel field effect transistor having a drain terminal connected to the positive voltage via a first resistor; and the second n-channel field effect transistor for having a drain terminal connected to a positive voltage via a second resistor the drain terminal of the first n-channel field effect transistor connected to a series circuit of a first p-channel field effect transistor and of a third n-channel field effect transistor formed at a gate terminal of the first p-channel field effect transistor and the drain terminal of the second n-channel field effect transistor connected to a series circuit of a second p-channel field effect transistor and of fourth n-channel field effect transistor formed at a gate terminal of the second p-channel field effect transistor; the series circuits mutually connected to a gate terminal of the fourth n-channel field effect transistor via a gate terminal and via a drain terminal of the third n-channel field effect transistor; both series circuits connected to the positive voltage via source terminals of the first p-channel field effect transistor and of the second p-channel field effect transistor and connected to ground via source terminals of the third n-channel field effect transistor and of the fourth n-channel field effect transistor.

10. The ECL-compatible input/output circuit in CMOS technology according to claim 9, wherein the resistors are each formed of a p-channel field effect transistor; a gate terminal and a drain terminal of the respective p-channel field effect transistors connected in common.

11. The ECL-compatible input/output circuit in CMOS technology according to claim 1, wherein the comparator contains a differential amplifier having a current mirror circuit and two resistors; the differential amplifier formed of two n-channel field effect transistors having two inputs and having source terminals connected to ground via a drain terminal of a third n-channel field effect transistor; a gate terminal of the third n-channel field effect transistor connected to a junction of the two resistors which are connected between the positive voltage and ground; the current mirror circuit containing two p-channel field effect transistors having source terminals wired to the positive voltage, a drain terminal of a first p-channel field effect transistor connected to the gate terminals of the first and second p-channel field effect transistor and with a drain terminal of the first n-channel field effect transistor, a drain terminal of the second p-channel field effect transistor connected to an output and to a drain terminal of the second n-channel field effect transistor.

12. The ECL-compatible input/output circuit in CMOS technology according to claim 11, wherein the first resistor is formed of two series-connected p-channel field effect transistors; a gate terminal and a drain terminal fo the two p-channel field effect transistors connected in common; and wherein the second resistor is formed of an n-channel field effect transistor having a gate and a drain terminal connected in common.

13. The ECL-compatible input/output circuit in CMOS technology according to claim 1, wherein the low-pass filter contains a p-channel field effect transistor having source and drain terminals in the series arm and a gate terminal and a capacitor in the shunt arm.

14. The ECL-compatible input/output circuit in CMOS technology according to claim 1, wherein the reference current source contains $m-4$, where m is a whole number, current mirror circuits and a p-channel field effect transistor; an input of the reference current source connected to a gate terminal of the p-channel field effect transistor, a source terminal thereof connected to the positive voltage and a drain terminal thereof connected to an input of a first current mirror circuit of the $m-4$ current mirror circuits; the first current mirror circuit connected to ground and an output of the first current mirror circuit connected to an input of the remaining current mirror circuits of the $m-4$ current mirror circuits; these remaining current mirror circuits connected to the positive voltage.

15. The ECL-compatible input/output circuit in CMOS technology according to claim 14, wherein the first current mirror circuit contains two n-channel field effect transistors; a gate terminal of a first n-channel field effect transistor of the two n-field effect transistors connected to a gate terminal and to a drain terminal of a second n-channel field effect transistor which form the input of the first current mirror circuit; source terminals of both field effect transistors connected to ground; a drain terminal of the first field effect transistor forming an output of the first current mirror circuit; the remaining current mirror circuits containing a shared, first p-channel input transistor and a respecitve plurality of p-channel output transistors; a gate terminal of the p-channel input transistor connected to its drain terminal and forming the input of the first current mirror circuit and connected to gate terminals of each of the p-channel output transistors; drain terminals of each of the p-channel output transistors forming a plurality of outputs; and the drain terminals of each of the p-channel output transistors of the remaining current mirror circuits connected to a positive voltage.

* * * * *